(12) United States Patent
Huang (10) Patent No.: US 6,232,607 B1
(45) Date of Patent: May 15, 2001

(54) HIGH RESOLUTION FLAT PANEL FOR RADIATION IMAGING

(75) Inventor: Zhong Shou Huang, Mississauga (CA)

(73) Assignee: Ifire Technology Inc., Alberta (CA)

( * ) Notice: Subject to any disclaimer, the term of this patent is extended or adjusted under 35 U.S.C. 154(b) by 0 days.

(21) Appl. No.: 09/180,091

(22) PCT Filed: May 8, 1996

(86) PCT No.: PCT/CA96/00294

§ 371 Date: Nov. 2, 1998

§ 102(e) Date: Nov. 2, 1998

(87) PCT Pub. No.: WO97/42661

PCT Pub. Date: Nov. 13, 1997

(51) Int. Cl.$^7$ .................................................. H01L 31/02
(52) U.S. Cl. ............................... 250/370.09; 250/370.08; 250/370.11
(58) Field of Search ........................ 250/370.09, 370.08, 250/370.11

(56) References Cited

U.S. PATENT DOCUMENTS

| | | |
|---|---|---|
| 4,382,187 | 5/1983 | Fraleux et al. . |
| 4,785,186 | 11/1988 | Street et al. . |
| 4,799,094 | 1/1989 | Rougeot . |
| 4,810,881 | 3/1989 | Berger et al. . |
| 4,945,243 | 7/1990 | Arques . |
| 5,017,989 | 5/1991 | Street et al. . |
| 5,079,426 | 1/1992 | Antonuk et al. . |
| 5,132,541 | 7/1992 | Conrads et al. . |
| 5,182,624 | 1/1993 | Tran et al. . |
| 5,184,018 | 2/1993 | Conrads et al. . |
| 5,187,369 | 2/1993 | Kingsley et al. . |
| 5,254,480 | 10/1993 | Tran . |
| 5,262,649 | 11/1993 | Antonuk et al. . |
| 5,315,101 | 5/1994 | Hughes et al. . |
| 5,315,102 | 5/1994 | Abe et al. . |
| 5,340,988 | 8/1994 | Kingsley et al. . |
| 5,368,882 | 11/1994 | Tran et al. . |
| 5,396,072 | 3/1995 | Schiebel et al. . |
| 5,420,454 | 5/1995 | Vook et al. . |
| 5,436,458 | 7/1995 | Tran et al. . |
| 5,444,756 | 8/1995 | Pai et al. . |
| 5,480,810 | 1/1996 | Wei et al. . |
| 5,480,812 | 1/1996 | Salisbury . |
| 5,929,449 | * 7/1999 | Huang .............................. 250/370.09 |
| 5,930,591 | * 7/1999 | Huang ..................................... 438/36 |
| 5,962,856 | * 10/1999 | Zhao et al. ....................... 250/370.09 |
| 6,013,923 | * 1/2000 | Huang ..................................... 257/59 |

OTHER PUBLICATIONS

"Design of Future All–Solid–State Displays", John C. Barrett IEEE Journal of Solid–State Circuits, vol. SC–4, No. 6, Dec. 1969.

"A Thin–Film Transistor for Flat Panel Displays", Fang Chen, Luo, Inan Chen and Frank C. Genovese IEEE Transactions on Electron Devices, vol. ED–28, No. 6, Jun., 1981.

* cited by examiner

*Primary Examiner*—Constantine Hannaher
*Assistant Examiner*—Otilia Gabor
(74) *Attorney, Agent, or Firm*—Fay, Sharpe, Fagan, Minnich & McKee LLP (57) ABSTRACT

A high resolution flat panel for radiation imaging includes an array of pixels arranged in rows and columns. Gate lines interconnect the pixels of the rows while source lines interconnect the pixels of the columns. Gate driver circuits provide gate pulses to the gate lines in succession in response to input from a control circuit to select the pixels on a row-by-row basis. The source lines lead to charge amplifiers for sensing the signal charges stored by the pixels when the pixels are selected. At least one pair of adjacent pixels in each row of the array shares a source line. Gating of the pairs of pixels in the rows that share a source line is controlled by control logic to ensure that signal charges stored by only one of those pixels is applied to a shared source line at a time. This allows the number of charge amplifiers in the flat panel to be reduced while maintaining high resolution.

15 Claims, 8 Drawing Sheets

HIGH RESOLUTION FLAT PANEL FOR RADIATION IMAGING

TECHNICAL FIELD

The preset invention relates to imaging systems and in particular to a high resolution flat panel for radiation imaging and to a compensation circuit for an amplified flat panel for radiation imaging.

BACKGROUND ART

Flat panels for radiation imaging have been extensively studied for over ten years, and are well known in the art. Examples of flat panels for radiation imaging can be found in the following patents:

U.S. Pat. Nos. 5,132,541, 5,184,018, 5,396,072 and 5,315,101 assigned to Philips;

U.S. Pat. Nos. 4,785,186 and 5,017,989 assigned to Xerox;

U.S. Pat. Nos. 4,382,187, 4,799,094, 4,810,881, and 4,945,243 assigned to Thomson-CSF;

U.S. Pat. Nos. 5,182,624, 5,254,480, 5,368,882, 5,420,454, 5,436,458 and 5,444,756 assigned to 3M;

U.S. Pat. Nos. 5,079,426 and 5,262,649 assigned to Michigan University;

U.S. Pat. Nos. 5,340,988, 5,399,884, 5,480,810, 5,480,812 and 5,187,369 assigned to General Electric; and U.S. Pat. No. 5,315,102 assigned to Fuji Xerox.

One type of flat panel radiation imaging system includes a thick amorphous selenium (a-Se) film on an array of pixels such as that described in the article entitled "Flat Panel Detector for Digital Radiology Using Active Matrix readout of Amorphous Selenium," by W. Zhao et al., Medical Imaging 96, SPIE Conference, SPIE 2708, February 1996. In this flat panel radiation imaging system, the pixels are arranged in rows and columns with each pixel including a TFT switch. Gate lines interconnect the TFT switches in each row of the array while source or data lines interconnect the TFT switches in each column of the array. The thick amorphous selenium film is deposited directly on top of the TFT switch array and a top electrode overlies the amorphous selenium film.

When x-rays are incident on the amorphous selenium film and the top electrode is biased with a high voltage, electron-hole pairs are separated by the electric field across the thickness of the amorphous selenium film. The holes, which are driven by the electric field, move toward the pixel electrodes (i.e. the drain electrodes of the TFT switches) and accumulate in a storage capacitor in each pixel. This results in a charge being held by the pixel electrodes which can be used to develop an x-ray image.

The charges held by the pixel electrodes are read on a row-by-row basis by supplying gating pulses to each gate line in succession. When a gating pulse is supplied to a gate line, the TFT switches of the pixels in the row associated with that gate line turn on, allowing the signal charges stored in the storage capacitor of those pixels to flow to the source lines. Ideally, the TFT switches of the array should be controlled only by the potential voltage on the gate electrode. However, stray electric fields from the amorphous selenium film and the top electrode, which can be up to 10V/m, can have significant effects on the channel conductance of the TFT switches unless special shielding techniques are used. One such shielding technique is to provide a dual-gate structure in the TFT switches. In these TFT switches, one gate is disposed below the semiconductor channel layer and the other gate is positioned above the semiconductor channel layer. The two gates are electrically connected together. An example of a dual-gate TFT switch is disclosed in "IEEE Transactions on Electronic Devices-28, No.6, pp.740–743, June 1981" by F. C. Luo et al.

Also, in medical x-ray imaging systems, signal levels are generally much lower than visible light imaging systems, in order to minimize the exposure of patients to x-rays. Therefore, in order to obtain high resolution, a high signal to noise ratio is extremely important. In order to improve the signal to noise ratio in x-ray imaging systems, amplified imaging pixels for flat panels have been considered such as those described in the "IEEE Journal of Solid-State Circuits, Vol. SC-4, No.6, pp. 333–342, December 1969" by S.G. Chamberlain and in the "Proceedings of IEDM'93, pp 575–578, December 1993" by H. Kawashima et al.

In order to reduce the switch noise caused by parasitic capacitance distributed along the source lines and maximize the signal to noise ratio, a charge amplifier is provided for each column of TFT switches in the pixel array. The charge amplifiers sense the charges on the source lines when a row of pixels is gated and provide output voltage signals proportional to the charges and hence, proportional to the exposure of the pixels to radiation. Unfortunately, by providing a charge amplifier for each source line, two problems result. Firstly, in large format radiation imaging systems which include in excess of one thousand (1000) source lines, the cost associated with the charge amplifiers is significant. Secondly, in high resolution radiation imaging systems that have a small pixel pitch, it is difficult to wire-bond the charge amplifiers to each source line. Accordingly, there is a need for an improved high resolution flat panel for radiation imaging.

It is therefore an object of the present invention to provide a novel high resolution flat panel for radiation imaging and a compensation circuit for an amplified flat panel which obviates or mitigates at least one of the above-mentioned problems.

DISCLOSURE OF THE INVENTION

According to one aspect of the present invention there is provided a flat panel for radiation imaging comprising:

a radiation transducer to be exposed to incident radiation;

an array of pixels on one side of said radiation transducer, each of said pixels including a storage capacitor to store signal charge proportional to the exposure of said radiation transducer to radiation in the vicinity of said pixels;

a plurality of gate lines interconnecting the rows of pixels in said array, said gate lines receiving gate pulses to allow said pixels to be selected on a row-by-row basis;

a plurality of source lines interconnecting the columns of pixels in said array to allow the signal charges held by the storage capacitors of said selected pixels to be sensed, at least one pair of adjacent pixels in each row sharing a source line; and control means to control selection of the pixels sharing a source line so that the signal charge stored by the storage capacitor of only one pixel of each pair can be sensed by way of a shared source line at a time when said row of pixels is selected.

Preferably, the flat panel has multiple pairs of adjacent pixels in each row that share source lines. In one embodiment, during the first half time period of a gate pulse, the control means biases one pixel of the pairs of pixels sharing a source line to allow the signal charges held by those one pixels to be selected in response to the gate pulse, and during the remaining half time period of the gate pulse, the control means biases the other pixel of the pairs of pixels sharing a source line to allow the signal charges held by those other pixels to be selected in response to the gate pulse.

It is also preferred that the flat panel includes refresh means to refresh the storage capacitors of the pixels after the signal charges held thereby have been sensed. In one embodiment, each row of pixels is refreshed as the next row of pixels is being selected. In a different embodiment, the pixels of the flat panel are refreshed after all of the rows of pixels have been selected.

According to yet another aspect of the present invention there is provided a compensation circuit for use in a high resolution amplified flat panel for radiation imaging comprising:

an amplifier having an input terminal to receive amplified signal charge output on a source line by a selected pixel of said flat panel in response to a gate pulse, said amplified signal charge having a dc bias; and switch means to connect said input terminal to a potential voltage source when said amplified charge is received, said potential voltage source having a magnitude substantially the same as said dc bias but opposite in polarity to offset said dc bias.

The present invention provides advantages in that the need for a charge amplifier associated with each column of TFT switches in the array is obviated. This is achieved by allowing adjacent pixels in the rows of the array to share a source line and therefore a charge amplifier. The pixels sharing a source line are gated at different times to ensure that the signal charge stored by only one of those pixels is applied to a shared source line at a time to avoid mixing of signal charges and therefore maintain high resolution.

BRIEF DESCRIPTION OF THE DRAWINGS

Embodiments of the present invention will now be described more fully with reference to the accompanying drawings in which.

BEST MODES FOR CARRYING OUT THE INVENTION

Figure 1:
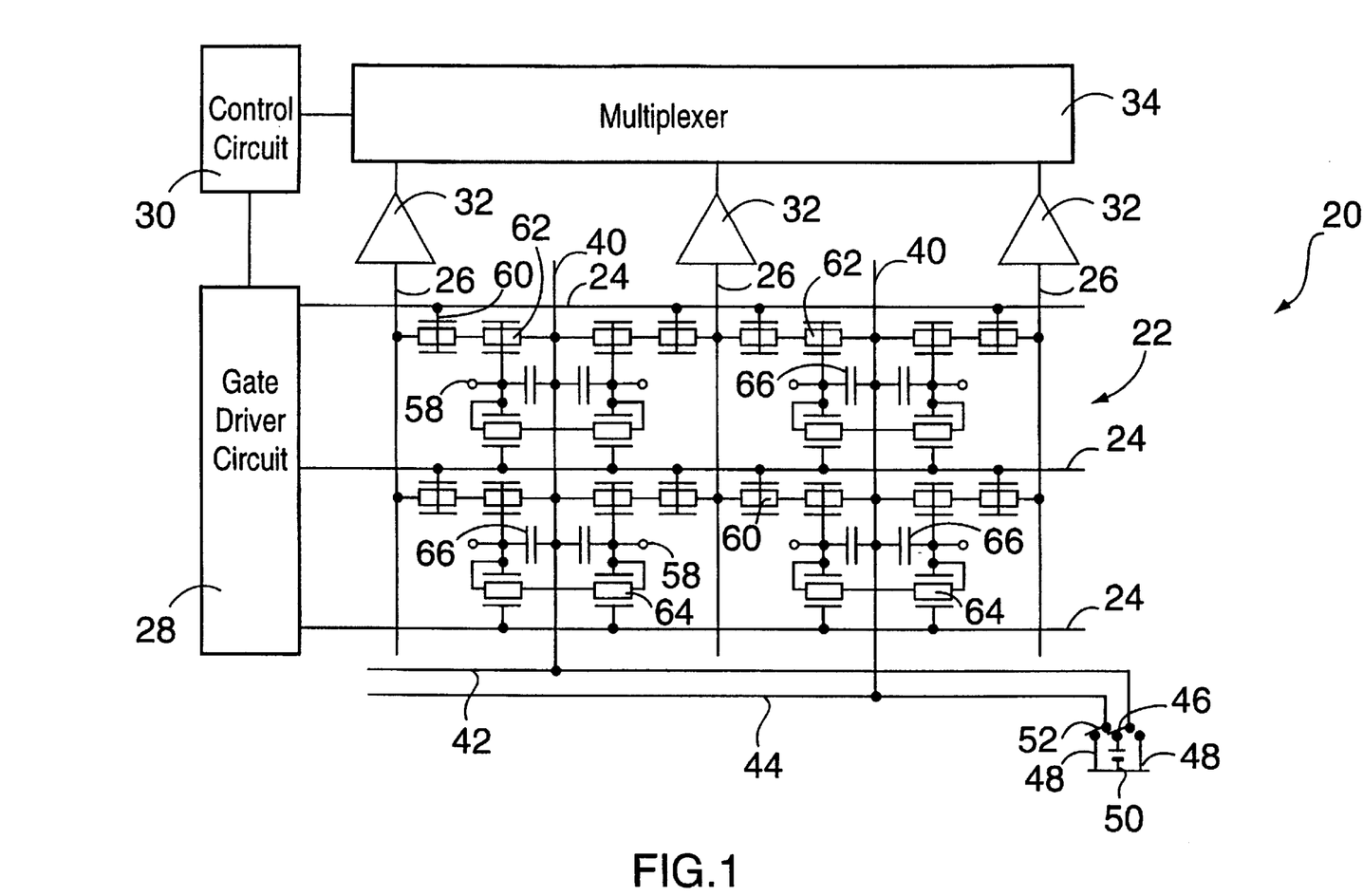
FIG. 1 is a schematic of a high resolution amplified flat panel for radiation imaging in accordance with the present invention.

Referring now to FIG. 1, a high resolution amplified flat panel for radiation imaging is shown and is generally indicated to by reference numeral 20. The flat panel 20 includes an array of pixels 22 arranged in rows and columns. In this particular example, the array is shown to include two rows and four columns. It should however be understood that this is for illustrative purposes only and that the array will typically include a significant number of pixels. Gate lines 24 interconnect the pixels 22 in the rows of the array while source lines 26 interconnect the pixels 22 in the columns of the array. The gate lines 24 lead to a gate driver circuit 28. The gate driver circuit 28 provides gate pulses to the gate lines in succession in response to input from a control circuit 30 to allow signal charge held by the pixels 22 in the array to be sensed on a row-by-row basis so that a radiation image of a subject or object can be developed.

The source lines 26 lead to charge or current amplifiers 32 (hereinafter referred to collectively as charge amplifiers) for sensing the signal charge held by the pixels 22. The charge amplifiers 32 provide output to an analog multiplexer 34. The analog multiplexer 34 provides image output which can be digitized to create a digitized radiation image of the subject or object in response to input from the control circuit 30. As can be seen, the second and third pixels 22 in each row share a source line 26 thereby allowing the number of charge amplifiers required to sense signal charge held by the pixels to be reduced as compared with conventional flat panels.

Control lines 40 also interconnect the pixels 22 in the columns of the array. The odd-numbered control lines are connected to a first buss 42 while the even-numbered control lines are connected to a second buss 44. Buss 42 leads to a switch 46 which is actuable to connect the buss 42 either to ground 48 or to a positive potential voltage source 50. Buss 44 leads to a switch 52 which is actuable to connect the buss either to ground 48 or to the potential voltage source 50. The switches 46 and 52 are controlled so that only one of the busses 42 or 44 is able to be connected to the potential voltage source 50 at a time.

Figure 2:
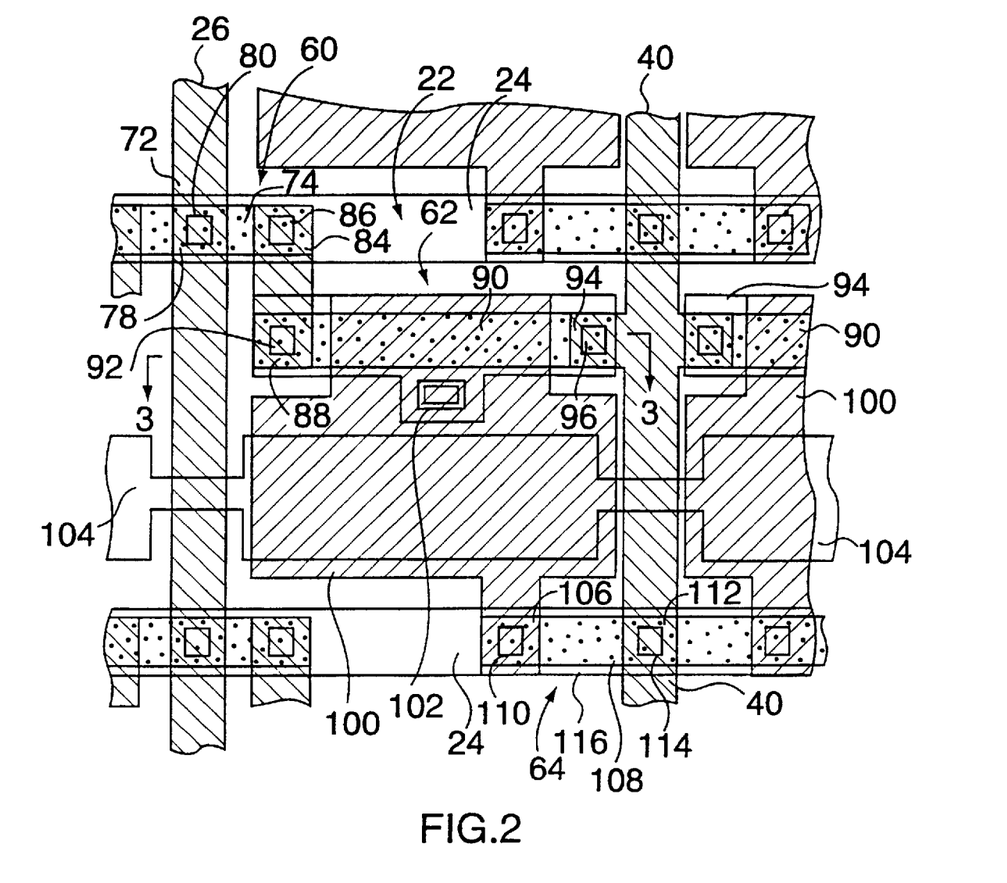
FIG. 2 is a top plan view of a pixel forming part of the high resolution amplified flat panel of FIG. 1.

Each pixel 22 in the array includes three thin film transistor (TFT) switches 60, 62 and 64 as well as a storage capacitor 66. TFT switch 62, is of a dual-gate structure and has a top gate electrode and a bottom gate electrode, the two of which are electrically connected. TFT switch 62 acts as an amplifier to amplify the signal charge held by the storage capacitor 66 and output a modulated drain current proportional to the held signal charge. The storage capacitor 66 is connected to the gate electrodes of TFT switch 62. Thus, signal charge stored by the storage capacitor 66 changes the gate potential of TFT switch 62 and in turn modulates its drain current. TFT switch 60, which can be of a dual-gate or a single-gate structure (as shown in FIG. 2), acts as a switch to connect the TFT switch 62 to the source line 26 to allow the modulated drain current of TFT switch 62 to flow to the charge amplifier 32. The TFT switch 64 acts as a reset switch to clear the signal charge held by storage capacitor 66 after the modulated drain current of TFT switch 62 has been sensed by the charge amplifier 32 and thereby refresh the pixel 22. The configuration of the pixels 22 will now be described further.

Figure 3:
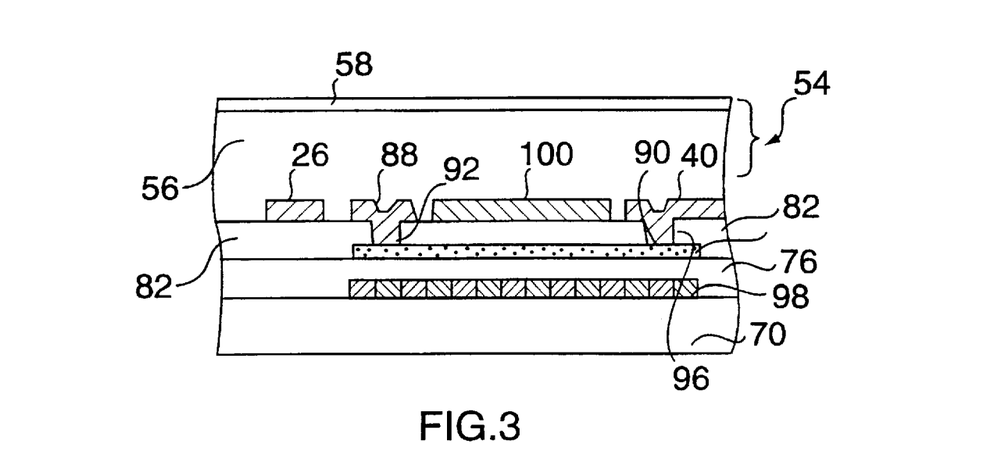
FIG. 3 is a cross-sectional view of the pixel of FIG. 2 taken along line 3—3.

The array of pixels 22, the gate lines 24, the source lines 26 and the control lines 40 are formed on a common glass substrate 70. FIGS. 2 and 3 better illustrate one of the pixels 22. As can be seen, TFT switch 60 has a gate electrode 72 constituted by a portion of a gate line 24. A semiconductor material channel layer 74 formed of Cadmium Selenide (CdSe) is deposited over the gate electrode 72 and is spaced from it by a gate insulating layer 76. The source electrode 78 of the TFT switch 60 contacts the channel layer 74 by way of a via 80 formed in a passivation layer 82 overlying the channel layer 74 and the gate insulating layer 76. The source electrode 78 is constituted by a portion of a source line 26. The drain electrode 84 of the TFT switch 60 contacts the channel layer 74 by way of a via 86 formed in the passivation layer 82. The drain electrode 84 of TFT switch 60 is electrically connected to the source electrode 88 of the TFT switch 62.

The source electrode 88 of TFT switch 62 contacts the channel layer 90 of the TFT switch by way of a via 92 formed in the passivation layer 82. The drain electrode 94 of TFT switch 62 also contacts the channel layer 90 by way of a via 96 formed in the passivation layer 82 and is constituted by a portion of a control line 40. A bottom gate electrode 98 runs beneath the channel layer 90 and is spaced from it by the gate insulating layer 76. The bottom gate electrode 98 is connected to a top gate electrode 100 by way of a pair of vias 102 formed in the gate insulating and passivation layers 76 and 82 respectively. The top gate electrode 100 overlies a common buss 104 connected to ground. The top gate electrode 100 and common buss 104 define the plates of the storage capacitor 66.

The top gate electrode 100 is also connected to the source electrode 106 of TFT switch 64. The source electrode 106 contacts the channel layer 108 of TFT switch 64 by way of a via 110 formed in the passivation layer 82. The drain electrode 112 of the TFT switch 64 contacts the channel layer 108 by way of a via 114 formed in the passivation layer 82 and is constituted by a portion of a control line 40. The gate electrode 116 of TFT switch 64 is constituted by a portion of another gate line 24.

Deposited on the array of pixels 22 is a radiation transducer 54. The radiation transducer 54 includes a layer of radiation sensitive material 56 and a top electrode 58 overlying the radiation sensitive material 56. It is preferred that the radiation sensitive material is in the form of a thick chalcogenide film including selenium, tellurium and other dopants such arsenic and fluor-complex. The top electrode 58 is biased by a voltage which is high enough to drive signal charges in the bulk of the layer of radiation sensitive material 56 towards the top gate electrodes 100 commonly referred to as pixel electrodes.

In operation, the top electrode 58 is biased to a high voltage and the flat panel 20 is exposed to incident radiation which has passed through the subject of object to be imaged. As the incident radiation interacts with the layer of radiation sensitive material 56, electron-hole pairs are generated and then separated by the electric field created across the thickness of the layer of radiation sensitive material 56. The holes are driven by the electric field towards and are accumulated by the top gate electrodes 100 of TFT switches 62. This results in signal charges being held by the storage capacitors 66 of the pixels 22 which are proportional to the amount of incident radiation on the pixels 22.

After the flat panel 20 has been exposed to incident radiation, the signal charges accumulated by the top gate electrodes 100 and held by the storage capacitors can be sensed on a row-by-row basis to allow a radiation image of the subject or object to be developed. The operation of the flat panel 20 to allow the signal charges stored by the storage capacitors 66 to be sensed will now be described with particular reference to FIGS. 1 and 11.

Figure 11:
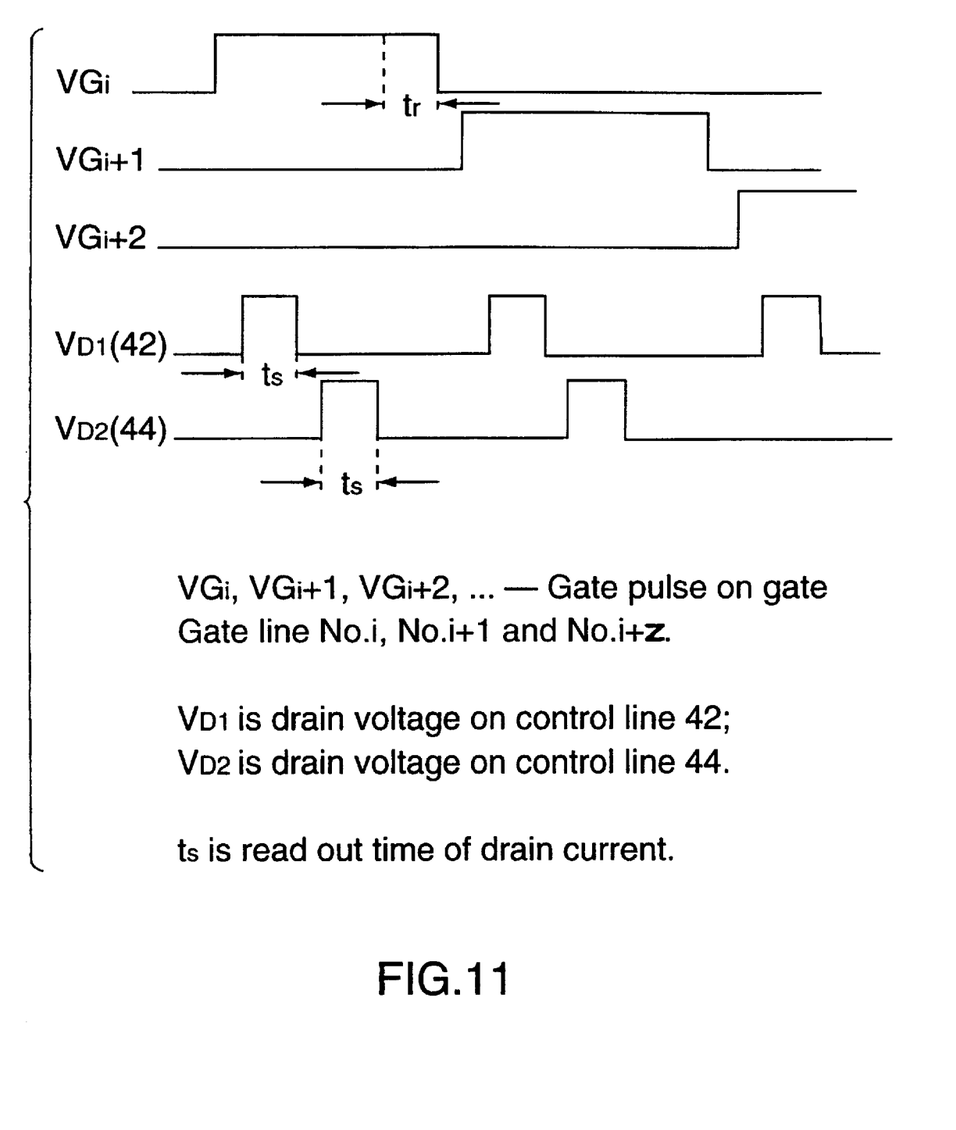
FIG. 11 is a timing diagram of the driving pulses generated during operation of the high resolution amplified flat panel of FIG. 1.

Initially, the switches 46 and 52 are connected to ground 48 so that no potential voltage exists on the control lines 40. A gate pulse VG1 is then applied to the first gate line 24 which causes all of the TFT switches 60 in the first row of pixels 22 to turn on. When the TFT switches 60 in the first row of pixels turn on, the drain currents of TFT switches 62 are ready to flow onto the source lines 26 through the TFT switches 60. However, the drain currents of the TFT switches 62 are dominated by both the potential on their gate electrodes and the source and drain electrode voltages. Since the source lines 26 are grounded through the charge amplifiers 32 and since no potential voltage exists on the control lines 40, the drain currents of TFT switches 62 are not output to the source lines 26 through the TFT switches 60.

Shortly after the gate pulse VG1 is applied to the first gate line 24, the switch 46 is actuated to connect buss 42 to the potential voltage source 50 for a duration ts which is significantly smaller than the duration of the gate pulse VG1. At this time, the control lines 40 connected to the buss 42 supply a potential voltage to the drain electrodes of the TFT switches 62 and 64 connected to them. Once the drain electrodes of the TFT switches 62 are biased by the potential voltage source 50, each TFT switch 62 connected to buss 42 by way of control line 40 supplies drain current, which has been modulated by the signal charge held by the storage capacitor 66, to the associated source line 26 through the TFT switch 60. The modulated drain currents supplied to the source lines 26 are in turn sensed by the charge amplifiers 32.

After duration ts, the switch 46 is actuated to connect buss 42 to ground to return the TFT switches 62 that were conducting to an off-condition. Shortly thereafter and while the gate pulse VG1 is still being applied to the first gate line 24, the switch 52 is actuated to connect the buss 44 to the potential voltage source 50 for a duration ts. At this time, the control lines 40 connected to the buss 44 supply a potential voltage to the drain electrodes of the TFT switches 62 and 64 connected to them. Once the drain electrodes of the TFT switches 62 are biased by the potential voltage source 50, each TFT switch 62 connected to buss 44 by way of control line 40 supplies drain current, which has been modulated by the signal charge held by the storage capacitor 66, to the associated source line 26 through the TFT switch 60. The modulated drain currents supplied to the source lines 26 are in turn sensed by the charge amplifiers 32.

After the duration ts, the switch 52 is actuated to connect the buss 44 to ground to return the TFT switches 62 that were conducting to an off-condition. The gate pulse VG1 is continued on the first gate line 24 for a duration tr and is then stopped. Once the gate pulse VG1 has ended, a gate pulse VG2 is applied to the second gate line 24 and the above sequence of events is performed to allow the modulated drain currents of the TFT switches 62 in the pixels 22 of the second row to be sensed. Once the drain currents for all of the pixels 22 in the second row have been sensed and during duration tr, the control lines 40 are connected to ground 48 by way of busses 42 and 44 and switches 46 and 52. Thus, no current flows to the source lines 26. However, the gate pulse VG2 is applied to the gate electrodes of the TFT switches 64 in the first row. The gate pulse VG2 in turn causes the TFT switches 64 in the first row to turn on. When the TFT switches 64 turn on, the top gate electrodes 100 and storage capacitors 66 of the pixels 22 in the first row are connected to the control lines 40. Since the control lines 40 are grounded, the storage capacitors 66 and top gate electrodes 100 also become grounded to remove signal charges held by the storage capacitor and thereby refreshing all of the pixels 22 in the first row.

The above steps are of course repeated until each row of pixels 22 in the flat panel 20 has received a gate pulse to allow the signal charges held by the storage capacitors to be sensed and each row of pixels has been refreshed.

As one of skill in the art will appreciate, the flat panel 20 allows the signal charge held by the storage capacitors 66 of the pixels 22 in the array to be sensed on a row-by-row basis while reducing the number of charge amplifiers as compared with prior art designs. This is achieved by allowing pairs of pixels in each row to share source lines and allowing the signal charge held by only one pixel of each pair to be sensed on the shared source line at a time.

Figure 4:
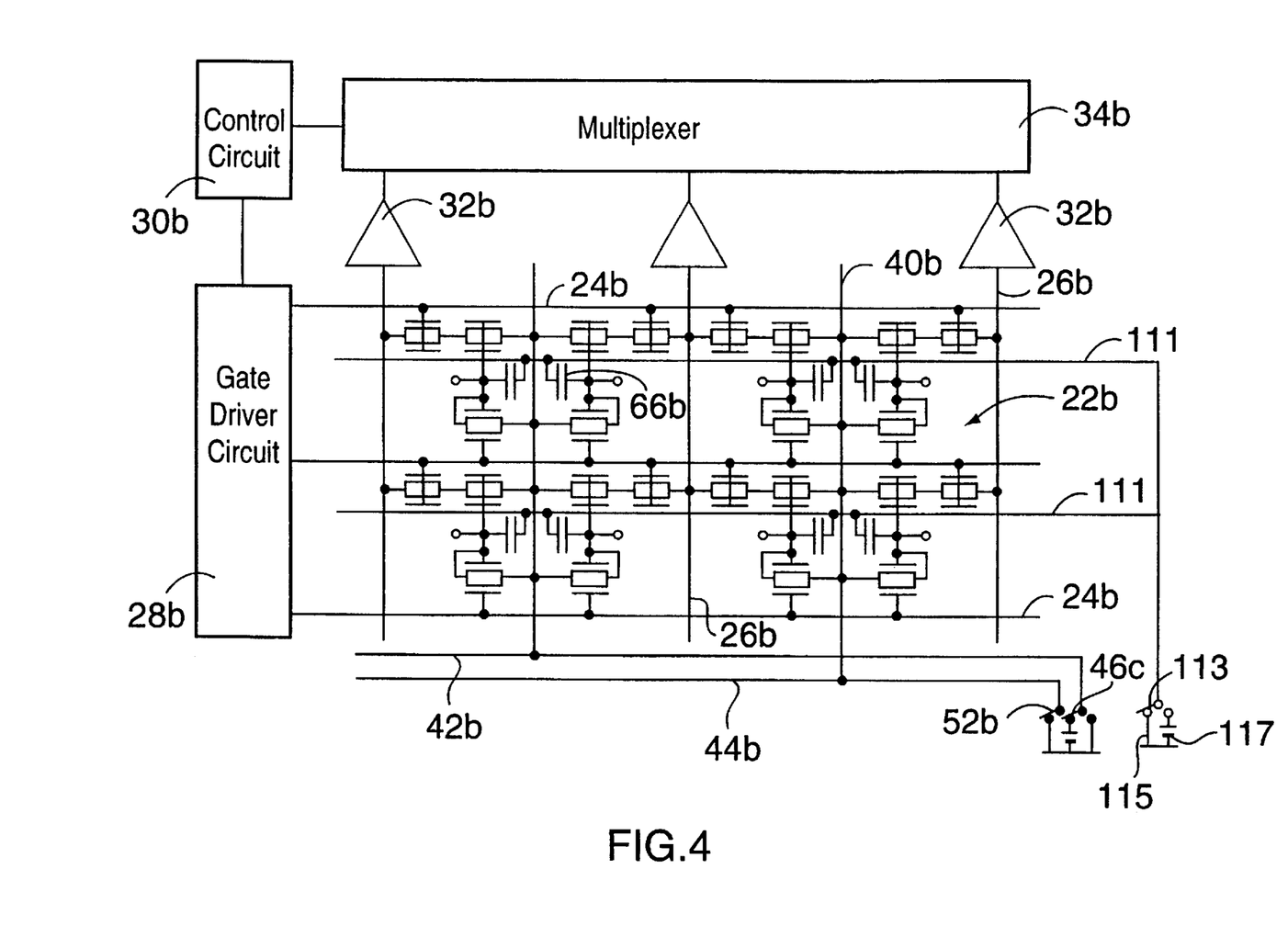
FIG. 4 is a schematic of an alternative embodiment of a high resolution amplified flat panel for radiation imaging in accordance with the present invention.

Referring now to FIG. 4, another embodiment of a high resolution amplified flat panel 20b is shown. In this embodiment, like reference numerals will be used to indicate like components of the first embodiment with a "b" added for clarity. In this embodiment, the storage capacitors 66b in each row of pixels 22b are connected to a buss 111. The busses 111 are interconnected and lead to a switch 113 which is actuable to connect the busses either to ground 115 or to a potential voltage source 117. This particular configuration allows the potential voltage applied to the gate electrodes of TFT switches 62b to be controlled through storage capacitors 66b by actuating the switch 113 to change the potential on the busses.

The operation of the flat panel 20b is very similar to that of the previous embodiment except that the busses 111 are connected to the potential voltage source 117 by way of switch 113 in order to modulate the output drain current of TFT switches 62b during sensing of the signal charges held by the storage capacitors 66b. If desired, the busses 111 can also be connected to the potential voltage source 117 by way of switch 113 when the pixels in the rows are being refreshed.

Figure 5:
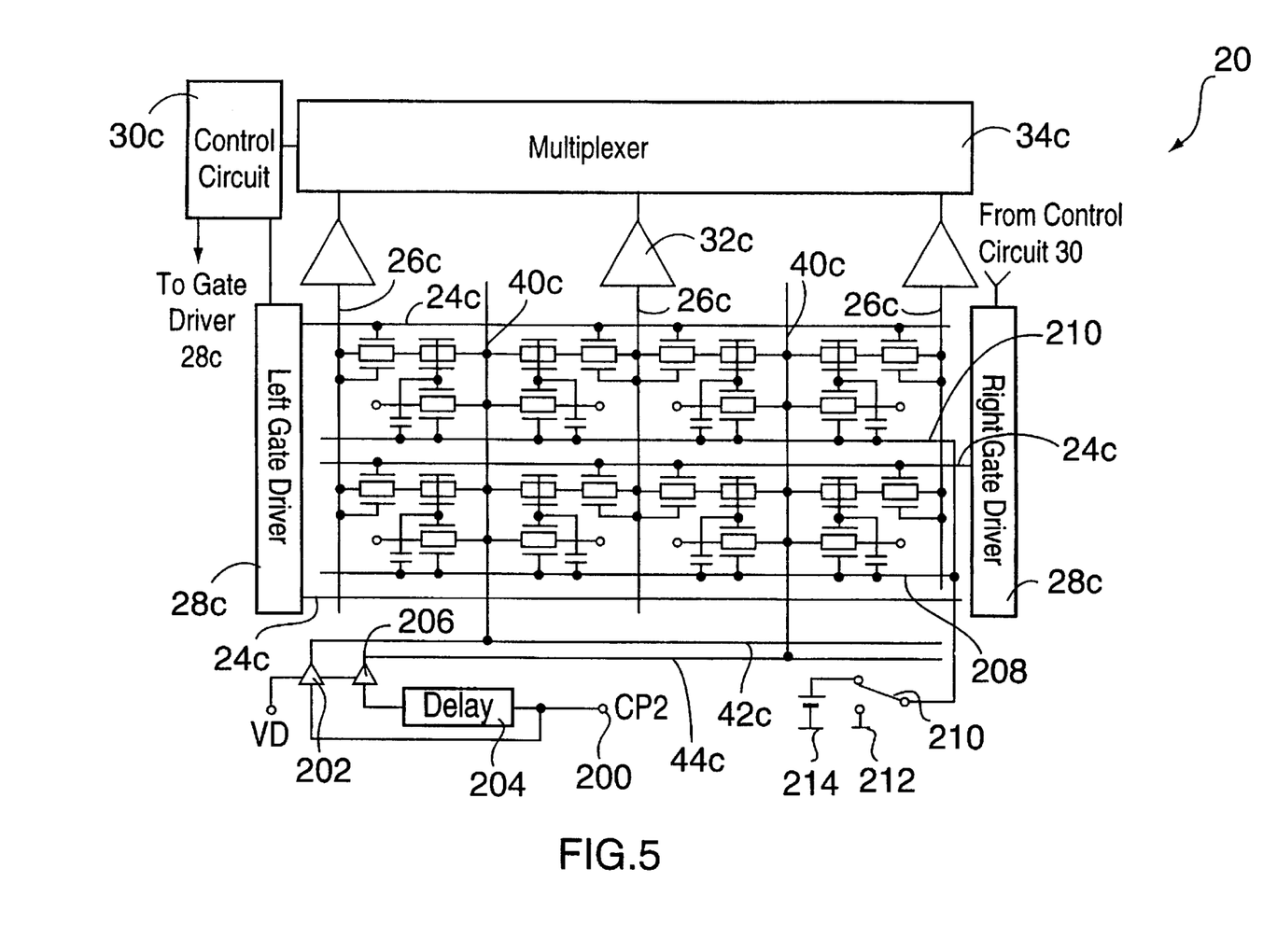
FIG. 5 is a schematic of yet another alternative embodiment of a high resolution amplified flat panel for radiation imaging in accordance with the present invention.

Referring now to FIG. 5, yet another alternative embodiment of a high resolution amplified flat panel 20c for radiation imaging is shown. In this embodiment, like reference numerals will be used to indicate like components of the first embodiment with a "c" added for clarity. In this embodiment, the odd-numbered gate lines 24c lead to a gate driver circuit 28c on one side of the array of pixels 22c while the even-numbered gate lines 24c lead to a gate driver circuit 28c on the opposite side of the array of pixels 22c. The buss 42c receives a control bias from a control node 200 by way of an amplifier 202 while the second buss 44c receives a control bias from the control node 200 by way of a delay circuit 204 and a second amplifier 206. The delay circuit 204 ensures that only one of the two busses 42c and 44c has a logic high control bias provided on it at a time and is synchronized with the gate pulse applied to each gate line 24c. In this manner, during a gate pulse, buss 42c receives a potential voltage for a duration ts during the first half of the gate pulse and following that, buss 44c receives a potential voltage for a duration ts during the remaining half of the gate pulse. Refresh lines 208 also interconnect the pixels 22c in the rows of the array. The refresh lines 208 are interconnected and lead to a switch 210 which is actuable to connect the refresh lines either to ground 212 or to a positive potential voltage source 214.

As can be seen, unlike the previous embodiments the rows of pixels 22c do not share gate lines 24c or refresh lines 208 with the previous or following rows of pixels. Also, the rows of pixels 22c are not refreshed until all of the rows of pixels 22c in the flat panel 20c have been readout. During signal charge readout, the operation of the flat panel 20c is very similar to that of the previous embodiments. Thus, signal charge stored by the storage capacitors 66c in each row of pixels are readout on a row-by-row basis. The pairs of pixels in each row that share a source line 26c are controlled during readout so that only one pixel of each pair applies modulated drain current to the source lines 26c at a time. Once all of the rows of pixels have been readout, the switch 210 is actuated to connect the refresh lines 208 to the potential voltage source 214. The bias applied to the refresh lines is applied to the gate electrodes of all of the TFT switches 64c causing the TFT switches 64c to turn on. When the TFT switches turn on, the gate electrodes of TFT switches 62c and the storage capacitors 66c are connected to the control lines 40c. During this period, the control lines 40c are grounded to remove signal charge held by the storage capacitors 66c and TFT switches 62c and thereby refresh the pixels 22c.

Figure 10:
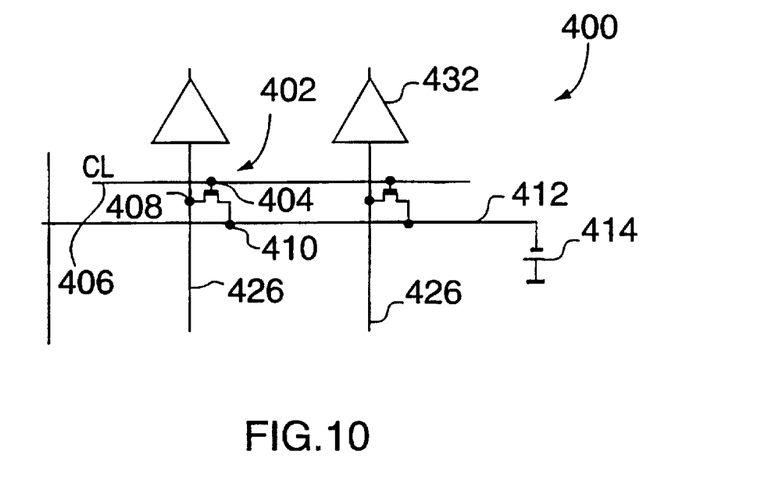
FIG. 10 is a schematic of a compensation circuit for use in the high resolution amplified flat panels of FIGS. 1 to 5.

Referring now to FIG. 10, a compensation circuit for use in a high resolution amplified flat panel for radiation imaging is shown and is indicated to generally by reference numeral 400. The compensation circuit 400 can be used with any of the flat panels previously described with reference to FIGS. 1 to 5. As can be seen, the compensation circuit 400 includes a transistor switch 402 associated with each of the source lines 426. The gate 404 of each transistor switch 402 is connected to a control bus 406. The source 408 of each transistor switch 402 is connected to the associated source line 426. The drain 410 of each transistor switch 402 is connected to another bus 412 leading to a negative potential voltage source 414. The magnitude of the potential voltage source 44 is selected so that it is approximately equal to the magnitude of the modulated drain current applied to a source line by a selected pixel which is located in a dark region of a radiation image.

When the amplified flat panels are being gated and the signal charges held by the storage capacitors are being readout, the modulated drain currents applied to the source lines 426 have a positive dc component resulting from the TFT switches 62 which act as amplifiers. To offset this dc component, when the modulated drain currents are being sensed, a control signal is applied on control bus 406 to turn the transistor switches 402 on. When the transistor switches 402 are turned on, the source lines 426 are connected to the negative potential voltage source 414 by way of transistor switches 402 and the bus 412 to compensate for and offset the dc bias.

Figure 6:
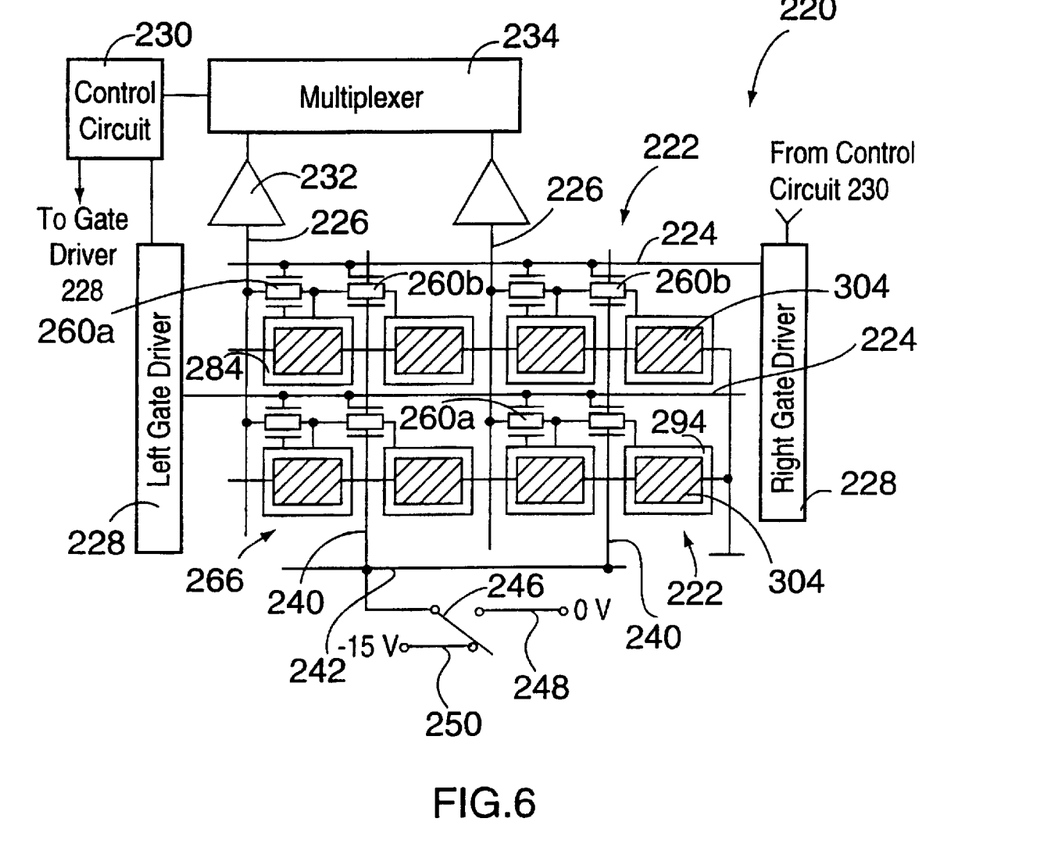
FIG. 6 is a schematic of a high resolution flat panel for radiation imaging in accordance with the present invention.
Figure 7:
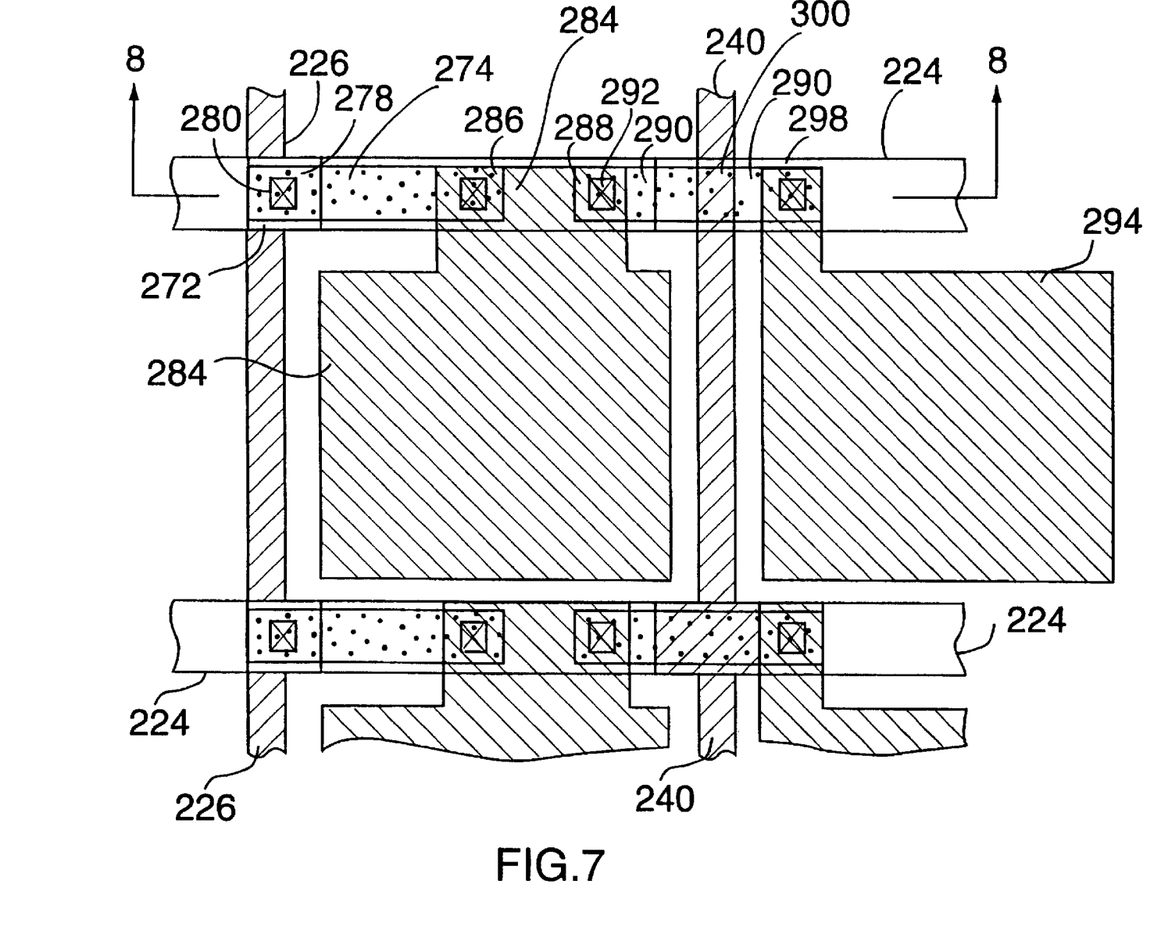
FIG. 7 is a top plan view of a pixel forming part of the high resolution flat panel of FIG. 6.
Figure 8:
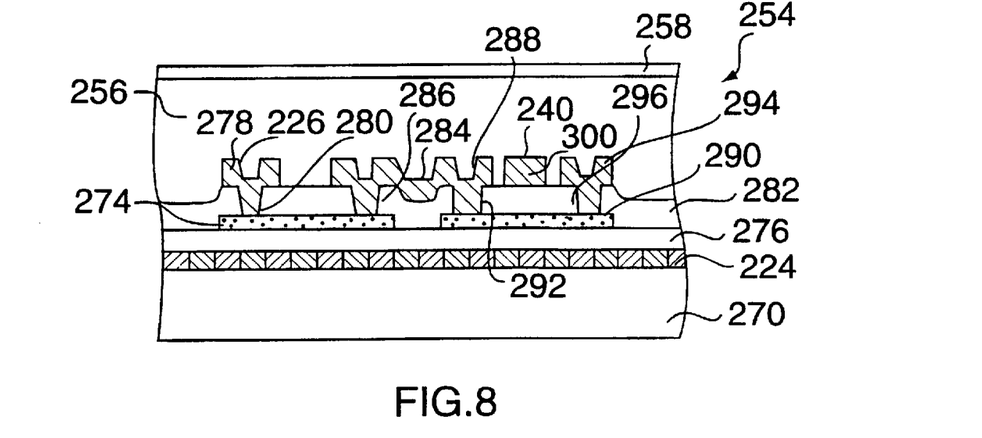
FIG. 8 is a cross-sectional view of FIG. 7 taken along line 8—8.

Referring now to FIGS. 6 to 8, an embodiment of a high resolution non-amplified flat panel for radiation imaging is shown and is generally indicated to by reference numeral 220. The flat panel 220 includes an array of pixels 222 arranged in rows and columns. Gate lines 224 interconnect the pixels 222 of the rows while source lines 226 interconnect the pixels 222 of the columns. The odd-numbered gate lines 224 lead to a gate driver circuit 228 on one side of the array of pixels 222 while the even-numbered gate lines 224 lead to a gate driver circuit 228 on the opposite side of the array of pixels 222. The gate driver circuits 228 provide gate pulses to the gate lines 224 in succession in response to input from a control circuit 230 to allow signal charge held by the pixels 222 in the array to be sensed on a row-by-row basis so that a radiation image of a subject or object can be developed.

The source lines 226 lead to charge amplifiers 232 for sensing the signal charge held by the pixels 222. The charge amplifiers provide output to an analog multiplexer 234. The analog multiplexer 234 provides image output which can be digitized to create a digitized radiation image in response to input from the control circuit 230. As can be seen, the first and second pixels and third and fourth pixels 222 in each row share a source line 226.

Control lines 240 also interconnect the pixels 222 in the even-numbered columns of the array of pixels. The control lines 240 are connected to a buss 242 which leads to a switch 246. The switch 246 is actuable either to connect the buss 242 to a high potential node 248, in this embodiment ground, or to a low potential node 250, in this embodiment −15V.

In this embodiment, each pixel 222 includes two TFT switches 260a and 260b. TFT switch 260a can be a single-gate or a dual-gate structure. TFT switch 260b is of a dual-gate structure. Thus, in the particular example shown, the TTF switches 260a in the odd-numbered columns of the array are of a single-gate structure while the TFT switches 260b in the even-numbered columns of the array are of a dual-gate structure.

The array of pixels 222, the gate lines 224, the source lines 226 and the control lines 240 are formed on a common glass substrate 270. FIGS. 7 and 8 better illustrate two adjacent pixels 222 in a row of the array of pixels 222. As can be seen, TFT switch 260a has a gate electrode 272 constituted by a portion of a gate line 224. A semiconductor material channel layer 274 formed of Cadmium Selenide (CdSe) is deposited over the gate electrode 272 and is spaced from it by a gate insulating layer 276. The source electrode 278 of the TFT switch 260a contacts the channel layer 274 by way of a via 280 formed in a passivation layer 282 overlying the channel layer 274 and the gate insulating layer 276. The source electrode 278 is constituted by a portion of a source line 226. The drain electrode 284 of the TFT switch 260a contacts the channel layer 274 by way of a via 286 formed in the passivation layer 282. The drain electrode 284 of TFT switch 260a overlies a common buss 304 connected to ground. The drain electrode 284 and common buss 304 define the plates of a storage capacitor 266.

The source electrode 288 of TFT switch 260b contacts the drain electrode 284 of TFT switch 260a as well as a channel layer 290 by way of a via 292 formed in the passivation layer 282. The drain electrode 294 of TFT switch 260b also contacts the channel layer 290 by way of a via 296 formed in the passivation layer 282. The drain electrode 294 also overlies the common buss 304 to define the plates of another storage capacitor 266. A bottom gate electrode 298 runs beneath the channel layer 290 and is spaced from it by the gate insulating layer 276. A top gate electrode 300 is deposited on the passivation layer 282 between the source and drain electrodes 288 and 294 respectively and overlies the channel layer 290. The top gate electrode 300 is constituted by a portion of the control line 240.

Deposited on the array of pixels 222 is a radiation transducer 254. The radiation transducer 254 includes a layer of radiation sensitive material 256 and a top electrode 258 overlying the radiation sensitive material 256. The top electrode 258 is biased by a voltage which is high enough to drive signal charges in the bulk of the layer of radiation sensitive material 256 towards the drain electrodes 284 and 294.

When the flat panel 220 has been exposed to incident radiation, the storage capacitors 266 of each pixel 222 hold a signal charge which is proportional to the exposure of the flat panel to radiation in the vicinity of the pixels 222. When it is desired to sense the stored signal charges, a gate pulse is applied on the first gate line 224. Prior to applying the gate pulse on the first gate line 224, the switch 246 is conditioned to connect the buss 242 to the negative potential voltage source 250. The negative potential voltage is therefore applied to the top gate electrodes 300 of the dual-gate TFT switches 260b in the first row preventing them from turning on in response to the gate pulse applied to the first gate line 224.

However, the gate pulse applied to the gate line 224 causes the single-gate TFT switches 260a in the row to turn on thereby connecting the drain electrodes 284 to the source lines 226 allowing the signal charge held by the drain electrodes 284 to be discharged on the source lines 226 and sensed by the charge amplifiers 232. This readout process is continued on a row-by-row basis until half of the pixels 222 in each row (i.e. the pixels in the odd-numbered columns of the array) have been sensed.

Once all of the pixels 222 in the odd-numbered columns of the array have been sensed, the switch 246 is actuated to connect the buss 242 to ground 248. Another gate pulse is then applied to the first gate line 224 which causes all of the TFT switches 260a and 260b in the row to turn on. Thus, the storage capacitors 266 are connected to the source lines 226 through the TFT switches 260a and 260b allowing the signal charges held by the storage capacitors 266 to be discharged on the source lines 226 and sensed by the charge amplifiers 232. Gate pulses are then applied to the remaining gate lines in succession to allow the remaining pixels 222 to be sensed.

Figure 9:
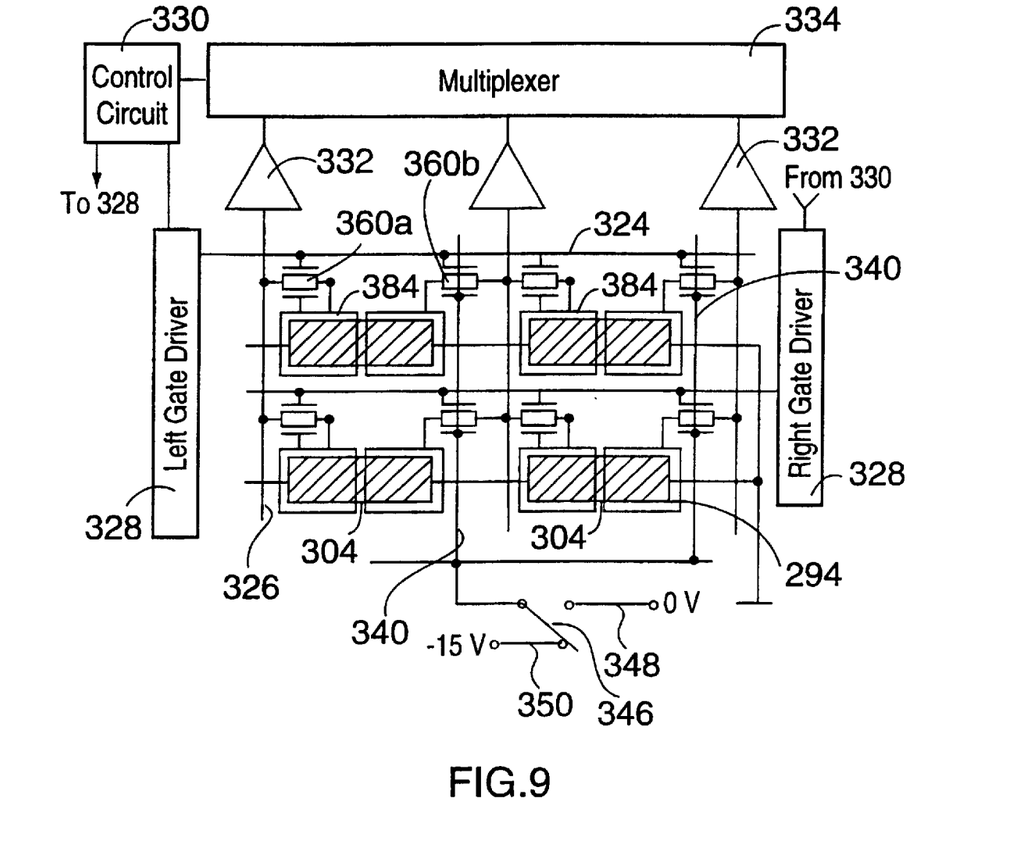
FIG. 9 is a schematic of an alternative embodiment of a high resolution flat panel for radiation imaging in accordance with the present invention.

Referring now to FIG. 9, an alternative embodiment of a high resolution non-amplified flat panel is shown and is generally indicated to by reference numeral 320. The flat panel 320 is very similar to that of the previous embodiment. However, unlike the previous embodiment, the dual-gate TFT switches 360b are connected directly to a. source line 326. Therefore, when the signal charges held by the storage capacitors 366 are to be sensed, the signal charges are discharged on to the source lines 326 only through the TFT switches 260b.

As those of skill in the art will appreciate, the high resolution flat panels allow radiation images to be developed while reducing the number of charge amplifiers required. This is achieved by allowing pairs of pixels in the same row of the pixel array to share source lines and controlling the gating of those pixels so that the signal charge held by only one pixel of each pair is allowed to be sensed on a source line at a time. In the particular embodiments of FIGS. 1 to 5, the held signal charges are amplified by the pixels before being discharged on the source lines while in the embodiments of FIGS. 6 to 9, the held signal charges are not amplified.

Although a number of embodiments of flat panels for radiation imaging have been disclosed, those of skill in the art will appreciate that variations and modifications may be made without departing from the scope of the present invention as defined by the appended claims.

What is claimed is:

1. A flat panel for radiation imaging comprising:
   a radiation transducer to be exposed to incident radiation;
   an array of pixels on one side of said radiation transducer, each of said pixels including a storage capacitor to store signal charge proportional to the exposure of said radiation transducer to radiation in the vicinity of said pixels;
   a plurality of gate lines interconnecting the rows of pixels in said array, said gate lines receiving gate pulses to allow said pixels to be selected on a row-by-row basis;

a plurality of source lines interconnecting the columns of pixels in said array to allow signal charges held by the storage capacitors of said selected pixels to be sensed, at least one pair of adjacent pixels in each row sharing a source line; and control means to control selection of the pixels sharing a source line so that the signal charge stored by the storage capacitor of only one pixel of each pair can be sensed by way of a shared source line at a time when said row of pixels is selected.

2. A flat panel as defined in claim 1 wherein multiple pairs of adjacent pixels in each row share source lines.

3. A flat panel as defined in claim 2 further including refresh means to refresh the storage capacitors of said pixels after the signal charges held thereby have been sensed.

4. A flat panel as defined in claim 3 wherein the pixels of said pairs of adjacent pixels are positioned on opposite sides of said shared source line.

5. A flat panel as defined in claim 4 wherein said control means biases one pixel of each pair of pixels sharing source lines in a manner to allow said one pixel to be selected in response to a first portion of a gate pulse and then biases the other pixel of each pair of pixels sharing said source lines in a manner to allow said other pixel to be selected in response to the remaining portion of said gate pulse.

6. A flat panel as defined in claim 5 wherein said control means includes control lines interconnecting columns of pixels in said array and a pair of busses, each of said busses being connectable to a positive potential voltage source or to ground by way of a switch, the control lines interconnecting adjacent columns of pixels sharing a source line being connected to different busses, said switches being controlled so that one of said busses biases said one pixels of said pairs of pixels during said first portion of said gate pulse and so that the other of said busses biases said other pixels of said pairs of pixels during said remaining portion of said gate pulse.

7. A flat panel as defined in claim 5 wherein each of said pixels includes an amplifier to amplify signal charge held by said storage capacitors when being sensed by way of said source lines.

8. A flat panel as defined in claim 7 further including a compensation circuit to offset dc bias applied to said amplified signal charges by said amplifiers.

9. A flat panel as defined in claim 3 wherein said refresh means refreshes said storage capacitors of a previous row of pixels during selection of a following row of pixels.

10. A flat panel as defined in claim 3 wherein said refresh means refreshes said storage capacitors of all of said pixels after all rows of said pixels have been selected.

11. A flat panel as defined in claim 2 wherein said control means biases one pixel of said pairs of pixels sharing a source line in a manner to inhibit said one pixels from being selected during a first gate pulse and then biases said one pixels in a manner to allow said one pixels to be selected in response to a second gate pulse applied on the same gate line.

12. A flat panel as defined in claim 11 wherein said first gate pulses are applied to each of said gate lines prior to applying said second gate pulses to said gate lines.

13. A flat panel as defined in claim 12 wherein said control means includes control lines interconnecting alternate columns of pixels in said array and a buss, said buss being connectable between a low potential voltage node and a high potential voltage node by way of a switch, said switch being controlled so that said buss is connected to said low potential voltage node during said first gate pulses to inhibit selection of said one pixels and so that said buss is connected to said high potential voltage node during said second gate pulses to permit selection of said one pixels.

14. A flat panel as defined in claim 13 wherein the pixels of said pairs of adjacent pixels are positioned on opposite sides of said shared source line.

15. A flat panel as defined in claim 13 wherein the pixels of said pairs of adjacent pixels are positioned on the same side of said shared source line, one pixel of said pairs being connected directly to said source line and the other pixel of said pairs being connected to said source line through said one pixels.

* * * * *